United States Patent
Lee

(10) Patent No.: US 11,985,777 B2
(45) Date of Patent: May 14, 2024

(54) DISPLAY DEVICE

(71) Applicant: Samsung Display Co., LTD., Yongin-si (KR)

(72) Inventor: Jung Hun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 316 days.

(21) Appl. No.: 17/564,869

(22) Filed: Dec. 29, 2021

(65) Prior Publication Data

US 2022/0369486 A1    Nov. 17, 2022

(30) Foreign Application Priority Data

May 11, 2021   (KR) .................. 10-2021-0060786

(51) Int. Cl.
   *H02H 1/00* (2006.01)
   *H05K 5/00* (2006.01)
   *H05K 5/02* (2006.01)
   *H05K 9/00* (2006.01)

(52) U.S. Cl.
   CPC ......... *H05K 5/0226* (2013.01); *H05K 5/0017* (2013.01); *H05K 9/0079* (2013.01)

(58) Field of Classification Search
   None
   See application file for complete search history.

(56) References Cited

U.S. PATENT DOCUMENTS

| | | | |
|---|---|---|---|
| 11,379,064 B2* | 7/2022 | Bok | H10K 50/826 |
| 11,832,406 B2* | 11/2023 | Kim | G06F 1/1652 |
| 2014/0104246 A1* | 4/2014 | Rao | G02F 1/13336 345/1.3 |
| 2019/0208649 A1* | 7/2019 | Jeon | H05K 5/0217 |
| 2021/0141124 A1* | 5/2021 | Park | G09F 9/301 |

FOREIGN PATENT DOCUMENTS

| | | |
|---|---|---|
| KR | 10-2019-0032688 | 3/2019 |
| KR | 10-2015398 | 8/2019 |
| KR | 10-2020-0121151 | 10/2020 |

* cited by examiner

*Primary Examiner* — Stephen W Jackson
(74) *Attorney, Agent, or Firm* — KILE PARK REED & HOUTTEMAN PLLC

(57) ABSTRACT

A display device includes a display panel including a side that displays an image, and an another side opposite to the side, a bottom layer disposed on the another side of the display panel, wherein the bottom layer includes a side facing toward the display panel, and an another side opposite to the side of the bottom layer, and a foldable member disposed on the another side of the bottom layer. The bottom layer includes a non-attached portion not attached to the foldable member; and a protective coating layer disposed on the another side of the bottom layer and overlapping the non-attached portion.

20 Claims, 11 Drawing Sheets

DISPLAY DEVICE

CROSS-REFERENCE TO RELATED APPLICATION(S)

This application claims priority to and benefits of Korean Patent Application No. 10-2021-0060786 under 35 U.S.C. § 119 filed in the Korean Intellectual Property Office (KIPO) on May 11, 2021, the entire contents of which are incorporated herein by reference.

BACKGROUND

1. Technical Field

The disclosure relates to a display device.

2. Description of Related Art

The importance of the display devices is increasing with the development of multimedia. In response to this trend, various types of the display devices such as a liquid crystal display device (LCD), and an organic light-emissive display device (OLED) have been used.

A mobile electronic device includes a display device for providing an image to a user. Recently, a bendable display device, a foldable display device, a rollable display device, or a slidable display device to which a flexible display panel that may be bent, folded, or rollable is applied has been developed. In designing the flexible display device, it is important to reduce damage to the flexible display panel and to reduce stress applied to the flexible display panel.

SUMMARY

Embodiments may provide a display device in which damage to a display panel is suppressed.

Additional features of embodiments will be set forth in the description which follows, and in part may be apparent from the description, or may be learned by practice of an embodiment or embodiments herein.

According to an embodiment, a display device may include a display panel including a side that displays an image, and another side opposite to the side, a bottom layer disposed on the another side of the display panel, the bottom layer including a side facing toward the display panel, and another side opposite to the side of the bottom layer, and a foldable member disposed on the another side of the bottom layer. The bottom layer may include a non-attached portion not attached to the foldable member; and a protective coating layer disposed on the another side of the bottom layer and overlapping the non-attached portion.

The protective coating layer may include at least one of a slip coating layer or an AS (anti-static) coating layer.

The protective coating layer may include an AS coating layer disposed on the another side of the bottom layer, and a slip coating layer disposed on the AS coating layer.

The bottom layer may include a metal plate.

The foldable member may include a hinge member for providing a pivoting axis, a first base member disposed on a side of the hinge member, a support member overlapping the first base member, a gap between the support member and the pivoting axis is maintained to be constant, a second base member disposed on an another side of the hinge member, and a slidable member connected to the second base member, the slidable member being slidable such that a gap between the slidable member and the pivoting axis varies.

The protective coating layer may contact the support member in case that the display panel is folded, and the protective coating layer may be spaced apart from the support member in case that the slidable member slides.

The protective coating layer may contact the second base member in case that the slidable member slides.

The protective coating layer may be slidable while contacting the second base member in case that the display panel slides.

The protective coating layer may be between the bottom layer and the support member in case that the display panel is folded, and the protective coating layer may be between the bottom layer and the second base member in case that the slidable member slides.

The display device may have a first state in which the display panel is unfolded to be flat, a second state in which the display panel is folded so that the side of the display panel is not exposed to an outside, and a third state in which the display panel has been moved from the second state so that a portion of the side of the display panel is exposed to the outside.

The protective coating layer may contact the foldable member in the third state.

The protective coating layer may be unfolded to be flat in the second state and may be bent in the third state.

The display panel may include a bent portion, the bent portion having a curvature in each of the second state and the third state, and a radius of curvature of the bent portion in the second state and a radius of curvature of the bent portion in the third state may be different from each other.

The bent portion may have a first radius of curvature in the second state, and may have a second radius of curvature in the second state, and the second radius may be greater than the first radius.

The protective coating layer may be disposed on the bent portion in the third state.

A position of the bent portion in the third state may be different from a position of the bent portion in the second state.

According to an embodiment, a display device includes a display panel including a side that displays an image, and another side opposite to the side, a bottom layer disposed on the another side of the display panel. The bottom layer may include a side facing toward the display panel, and another side opposite to the side of the bottom layer, a base member disposed on the another side of the bottom layer, a slidable member attachable on the another side of the bottom layer and slidably connected to the base member, and a protective coating layer disposed on the another side of the bottom layer. The protective coating layer may contact the base member in case that the slidable member slides.

The protective coating layer may include at least one of a slip coating layer and an AS (anti-static) coating layer.

The display device may further comprise a support member attachable on the another side of the bottom layer and spaced apart from the slidable member. The bottom layer may include a non-attached portion overlapping the support member and not attached to the support member. The protective coating layer may be disposed on the opposite face of the bottom layer and cover the non-attached portion.

The display panel may be folded to have a curvature, wherein a curvature of the display panel may vary in case that the slidable member slides.

The display device according to an embodiment may prevent the damage to the display panel.

Other features and embodiments may be apparent from the following detailed description, the drawings, and the claims.

BRIEF DESCRIPTION OF DRAWINGS

The accompanying drawings, which are included to provide a further understanding of the disclosure, illustrate embodiments in which.

DETAILED DESCRIPTION OF THE EMBODIMENTS

Figure 1:
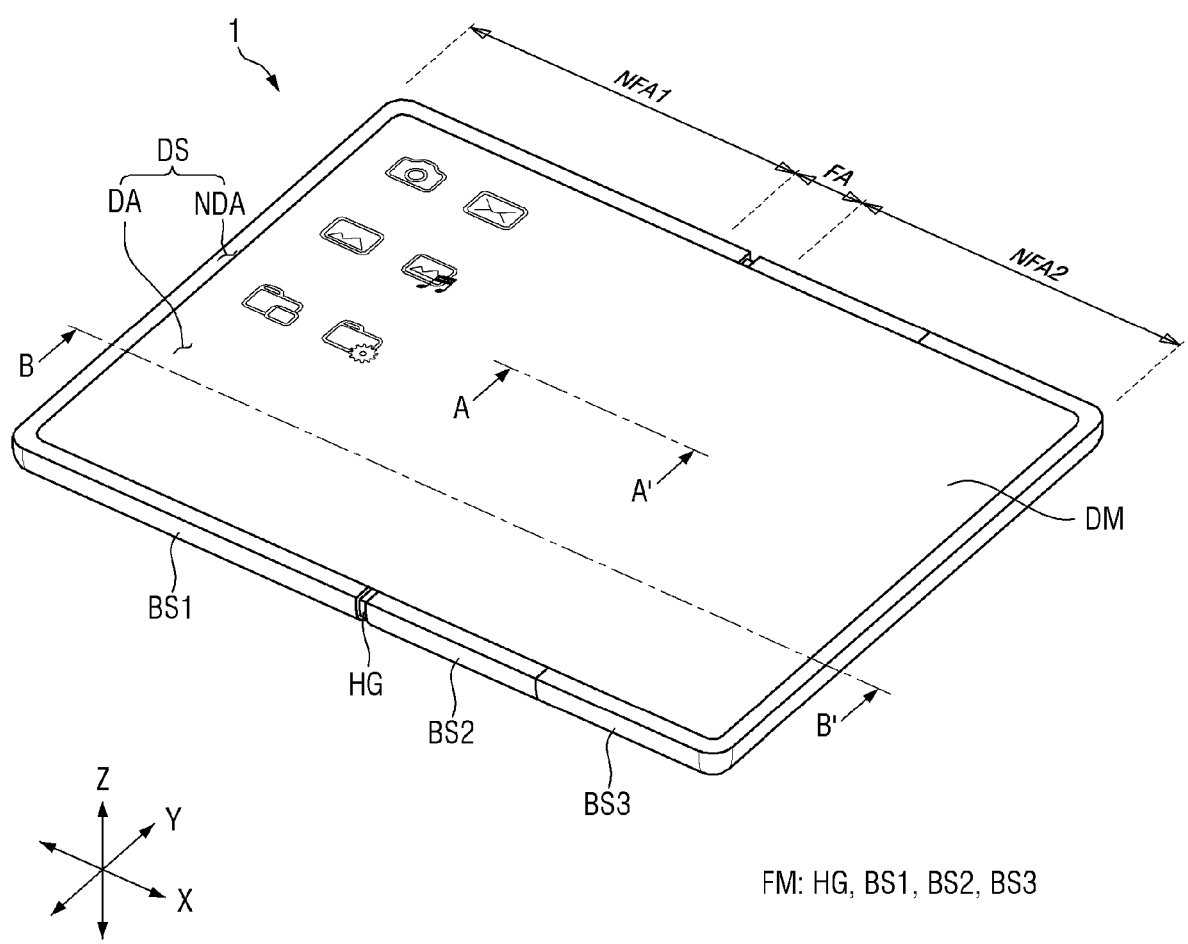
FIG. 1 is a schematic perspective view of a display device according to an embodiment in a first state.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include "apart from" or "set aside from" or "offset from" and any other suitable equivalents as would be appreciated and understood by those of ordinary skill in the art. The terms "face" and "facing" mean that a first object may directly or indirectly oppose a second object. In a case in which a third object intervenes between a first and second object, the first and second objects may be understood as being indirectly opposed to one another, although still facing each other.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has", "have", "having", "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within 30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
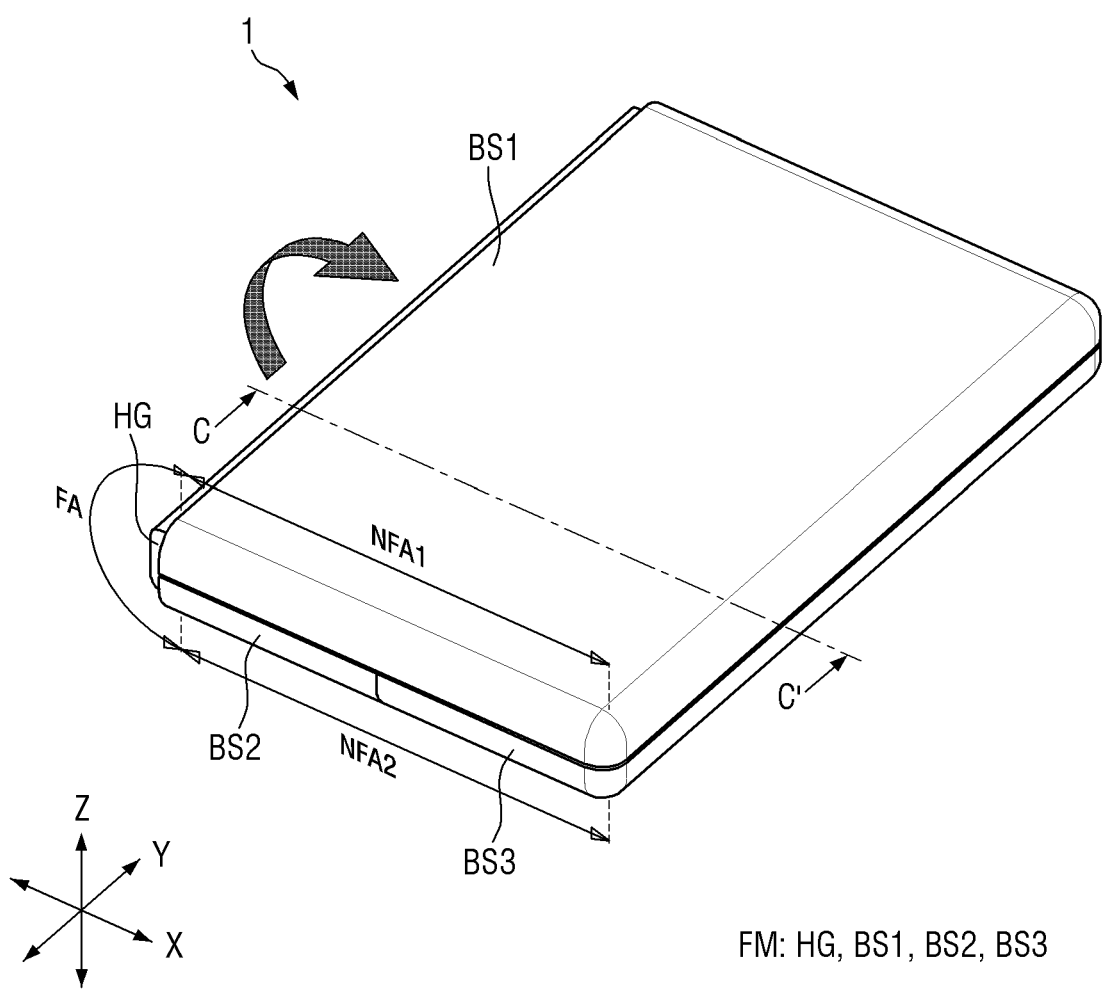
FIG. 2 is a schematic perspective view of a display device according to an embodiment in a second state.
Figure 3:
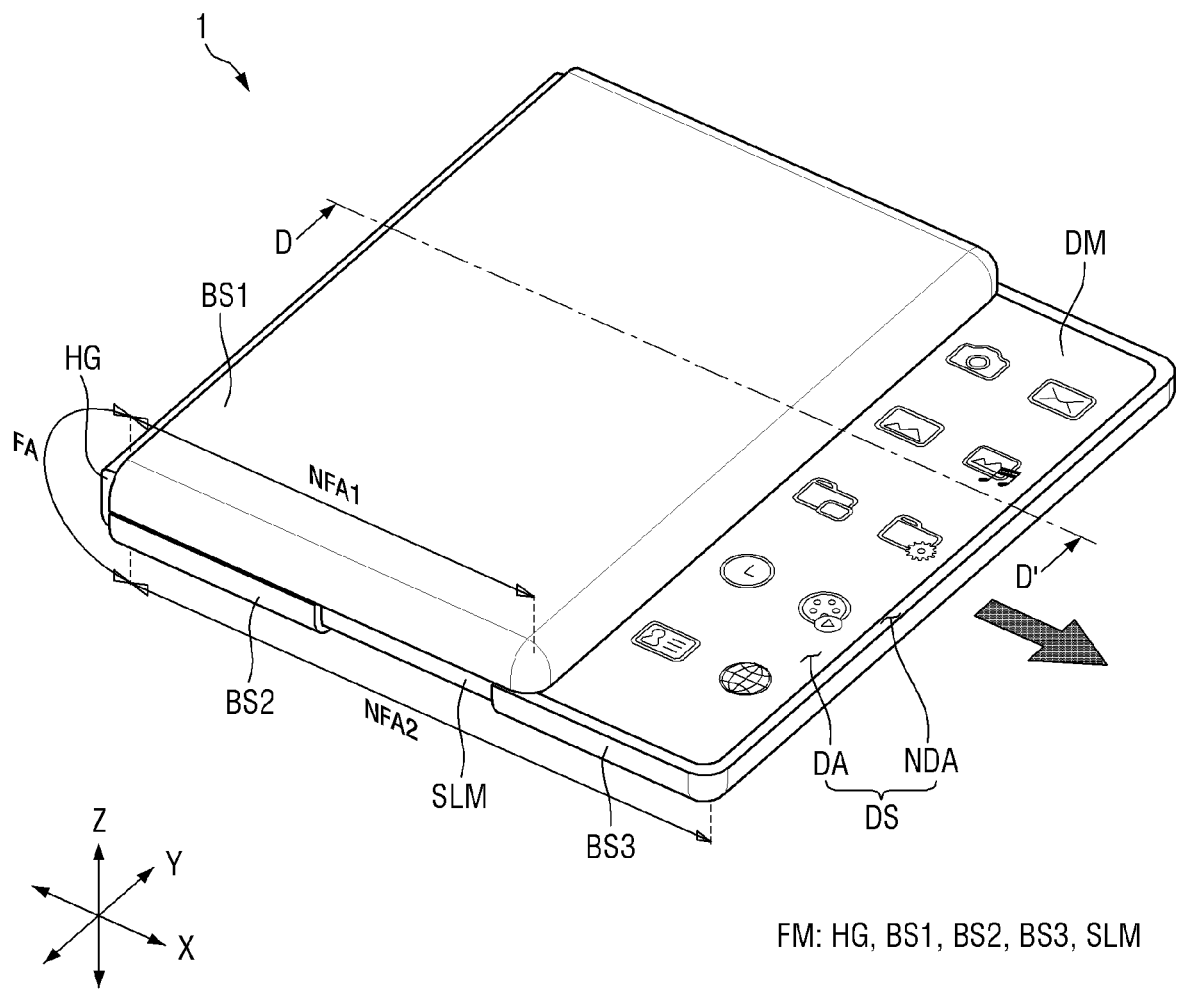
FIG. 3 is a schematic perspective view of a display device according to an embodiment in a third state.

FIG. 1 is a schematic perspective view of a display device according to an embodiment in a first state. FIG. 2 is a schematic perspective view of a display device according to an embodiment in a second state. FIG. 3 is a schematic perspective view of a display device according to an embodiment in a third state.

Hereinafter, a first direction X, a second direction Y and a third direction Z are different directions and intersect each other. For example, the first direction X may refer to a length direction, the second direction Y may refer to a width direction, and the third direction Z may refer to a thickness direction. Each of the first direction X, the second direction Y, and the third direction Z may include two or more directions. For example, the third direction Z may include an upward direction toward a top of a drawing and a downward direction toward a bottom of the drawing. However, the directions and names thereof should be construed in a relative manner. The disclosure is not limited to the example.

A display device 1 according to an embodiment may include various devices for displaying an image. The display device 1 may include for example, a smartphone, a mobile phone, a tablet personal computer (PC), a personal digital assistant (PDA), a portable multimedia player (PMP), a television, a game console, a wristwatch type electronic device, a head-mounted display, a personal computer monitor, a laptop computer, a car navigation system, an automotive dashboard, a digital camera, a camcorder, an outdoor billboard, an electric sign board, various medical devices, various inspection devices, various home appliances including displays such as refrigerators and washing machines, and Internet of things (IoT) devices. However, the disclosure is not limited thereto.

Referring to FIG. 1, the display device 1 may have a rectangular shape in a plan view. In an embodiment, the display device 1 may have both opposing long sides extending in the first direction X and both opposing short sides extending in the second direction Y intersecting the first direction X in a plan view. However, the disclosure is not limited thereto. The display device 1 may have various shapes.

Hereinafter, for convenience of description, when referring to faces of the display device 1 or each of members constituting the display device 1, a face (or side) facing in a direction in which an image is displayed is referred to as a top face (or top side), while an opposite face (or opposite side) to the face is referred to as a bottom face (or bottom side). However, the disclosure is not limited thereto. The face and the opposite face of the member may be referred to as a front face and a back face, respectively, or may be referred to as a first face and a second face, respectively.

The display device 1 may include a display area DA and a non-display area NDA (collectively referred to as a device surface DS).

The display area DA may display a still image or a moving picture. Pixels may be disposed in the display area DA. As shown in FIG. 1, the display area DA may be defined on a top face of the display device 1. However, the disclosure is not limited thereto. The display area DA may be further defined on at least one of a bottom face of the display device 1 and a side face between the top face and the bottom face of the display device 1.

A non-display area NDA may not display an image. The non-display area NDA may be disposed around the display area DA. The non-display area NDA may surround the display area DA. The non-display area NDA may be, for example, an area in which a light blocking member such as a black matrix is disposed. In an embodiment, the display area DA may have a rectangular shape, and the non-display area NDA may surround four sides of the display area DA. However, the disclosure is not limited thereto.

Referring to FIGS. 1 and 2, the display device 1 may be embodied as a foldable device that may be folded or unfolded.

An area of the display device 1 may be divided into a folding area FA and a non-folding area NFA1 and NFA2.

The folding area FA may be an area that is bent in case that the display device 1 is folded. The non-folding area NFA1 and NFA2 may be maintained to be flat while not being bent in case that the display device 1 is folded.

The non-folding area NFA1 and NFA2 may include a first non-folding area NFA1 and a second non-folding area NFA2.

The first non-folding area NFA1 and the second non-folding area NFA2 may be arranged in the first direction X. The folding area FA may be disposed between the first non-folding area NFA1 and the second non-folding area NFA2.

The display device 1 may be folded so that the first non-folding area NFA1 overlaps the second non-folding area NFA2, or may be bent so that the first non-folding area NFA1 is inclined with respect to the second non-folding area NFA2, or may be unfolded such that the first non-folding area NFA1 and the second non-folding area NFA2 are on a same plane. For example, the display device 1 may be folded so that the first non-folding area NFA1 defines an angle greater than or equal to about 0° and smaller than about 180° with respect to the second non-folding area NFA2, or may be unfolded such that the first non-folding area NFA1 defines 180° with respect to the second non-folding area NFA2.

As shown in FIG. 1, in case that the display device 1 is unfolded, the first non-folding area NFA1, the folding area FA, and the second non-folding area NFA2 are on a same plane so that they do not overlap each other in a thickness direction. As shown in FIG. 2, in case that the display device 1 is folded, the first non-folding area NFA1 and the second non-folding area NFA2 may overlap each other in the thickness direction. Although not shown in the drawings, in case that the display device 1 is folded, the first non-folding area NFA1 and the second non-folding area NFA2 may be inclined relative to each other at a predefined angle. In this case, at least a portion of the first non-folding area NFA1 and at least a portion of the second non-folding area NFA2 may or may not overlap each other in the thickness direction.

In an embodiment, a folding area FA and the two non-folding areas NFA1 and NFA2 are provided as an example. However, the number and arrangement of the folding area FA and the non-folding areas NFA1 and NFA2 are not limited thereto. Although not shown in the drawings, an area of each of members constituting the display device 1 may be divided into the folding area FA and/or the non-folding areas NFA1 and NFA2, based on an area in which each member is disposed.

As shown in FIG. 2, the display device 1 may be in-folded. The in-folding operation may be performed such that an entirety of the display area DA is not exposed to an outside in case that the display device 1 is folded. For example, the display device 1 may be folded such that a portion of the display area DA faces toward the other portion of the display area DA. An entirety of the display area DA may not be exposed to the outside while being surrounded by at least one member other than the display area constituting an outer appearance of the display device 1.

However, the disclosure is not limited thereto. Although not shown in the drawings, the display device 1 may be out-folded so that the display area DA is exposed to the outside. Specifically, the display device 1 may be folded such that a portion of the display area DA does not face toward the other portion of the display area DA, and the display area DA is exposed to the outside and thus constitutes at least a portion of the outer appearance of the display device 1. The display device 1 may be embodied as a foldable device capable of performing both of in-folding and out-folding operations.

Referring to FIGS. 1 to 3, in case that the display device 1 is folded, a portion of the display area DA may extend from the display device 1 and may be exposed to the outside. In this case, the other portion of the display area DA may be positioned inside the display device 1 and may not be exposed to the outside. Further, a portion of the display area DA exposed to the outside may retract into the display device 1 and thus may not be exposed to the outside. The display area DA may mean a display module DM which will be described later.

At least one member constituting the display device 1 may slide such that a portion of the display area DA may be exposed to the outside. As will be described later in FIGS. 6 to 9, the extending and retraction of the display area DA as described above may be carried out via slide movement of the display module DM that provides the display area DA and a slidable member SLM (see FIGS. 6 to 9) that supports the display module DM.

Referring to FIGS. 1 to 3, the display device 1 may have the first state in which the display device 1 is unfolded, the second state in which the display device 1 is folded, and the third state in which a portion of the display device 1 slides and is displaced. The display device 1 may be configured to be freely switchable to one of the first state, the second state, and the third state.

The first state may refer to a state in which the first non-folding area NFA1 and the second non-folding area NFA2 are on a same plane. The second state may refer to a state in which the first non-folding area NFA1 and the second non-folding area NFA2 are oriented in a parallel manner to each other and entirely overlap each other in the thickness direction. The third state may refer to a state in which the first non-folding area NFA1 and the second non-folding area NFA2 are oriented in a parallel manner to each other, but partially overlap each other in the thickness direction.

The first state, the second state, and the third state may respectively refer to a state in which an entirety of the display area DA is exposed to the outside, a state in which the entirety of the display area DA is not exposed to the outside, and a state in which only a portion of the display area DA is exposed to the outside.

The second state may include a state in which the display device 1 is fully folded, a state in which the display device 1 is half-folded, an in-folded state in which the display device 1 is in-folded, and an out-folded state in which the display device 1 is out-folded. The third state may refer to a state in which a portion of the display device 1 slides and is displaced so that at least one of the first non-folding area NFA1 and the second non-folding area NFA2 extends from the display device 1.

For example, the first state may refer to a state in which an angle between the first non-folding area NFA1 and the second non-folding area NFA2 of the display device 1 is about 180°. The second state and/or third state may refer to a state in which the angle between the first non-folding area NFA1 and the second non-folding area NFA2 of the display device 1 is greater than or equal to about 0° and smaller than about 180° and/or is greater than about 180° and smaller than about 360°.

Referring to FIGS. 1 to 3, the display device 1 may include the display module DM and a foldable member FM.

The display module DM and the foldable member FM may extend over the first non-folding area NFA1, the folding area FA, and the second non-folding area NFA2. The display module DM may define a top face of the display device 1, and the foldable member FM may be disposed on a bottom face of the display module DM to support the display module DM. The display module DM may be flexible so that at least a portion thereof may be bent. The foldable member FM may be configured to use a force applied from an outside to allow the display module DM to be bent.

The foldable member FM may include a hinge member HG, a first base member BS1, a second base member BS2 and a third base member BS3.

The hinge member HG may be mainly disposed in the folding area FA. The hinge member HG may provide at least one pivoting axis. The first base member BS1 and the second base member BS2 may pivot around the at least one pivoting axis. The hinge member HG may include a mechanical hinge and an elastic hinge. For example, the hinge member HG may include at least one member for folding or unfolding the display device 1, such as a hinge, a shaft, a rotor, and a cam.

The first base member BS1 may be mainly disposed in the first non-folding area NFA1. The first base member BS1 may pivot around the hinge member HG. The first base member BS1 may have a side which may be pivotably connected to a side of the hinge member HG.

The second base member BS2 and the third base member BS3 may be mainly disposed in the second non-folding area NFA2. The second base member BS2 and the third base member BS3 may pivot around the hinge member HG. The second base member BS2 and the third base member BS3 may be configured to pivot in a direction opposite to a direction in which the first base member BS1 pivots. The second base member BS2 may have a side which may be pivotably connected to an opposite side of the hinge member HG. The third base member BS3 may be disposed on an opposite side of the second base member BS2 opposite to a side of the second base member BS2. The second base member BS2 may be disposed between the hinge member HG and the third base member BS3.

Each of the second base member BS2 and the third base member BS3 may have a smaller size than that of the first base member BS1. In a plan view, a sum of areas of the second base member BS2 and the third base member BS3, and an area of the first base member BS1 may be substantially the same. Accordingly, as shown in FIG. 2, in case that the display device 1 is folded, both opposing edges of the first base member BS1 may be respectively aligned with an outer edge of the second base member BS2 and an outer edge of the third base member BS3.

In FIGS. 1 to 3, the first base member BS1, the second base member BS2, and the third base member BS3 are shown as a cover member constituting an outer appearance of the display device 1. However, the disclosure is not limited thereto. The first base member BS1, the second base member BS2, and/or the third base member BS3 may include other components constituting the display device 1 other than the display module DM, for example, a protective member for protection of the display module DM and a frame member on which an electronic component is mounted. In still another example, the first base member BS1, the second base member BS2, and/or the third base member BS3 may constitute a portion of the hinge member HG.

Figure 4:
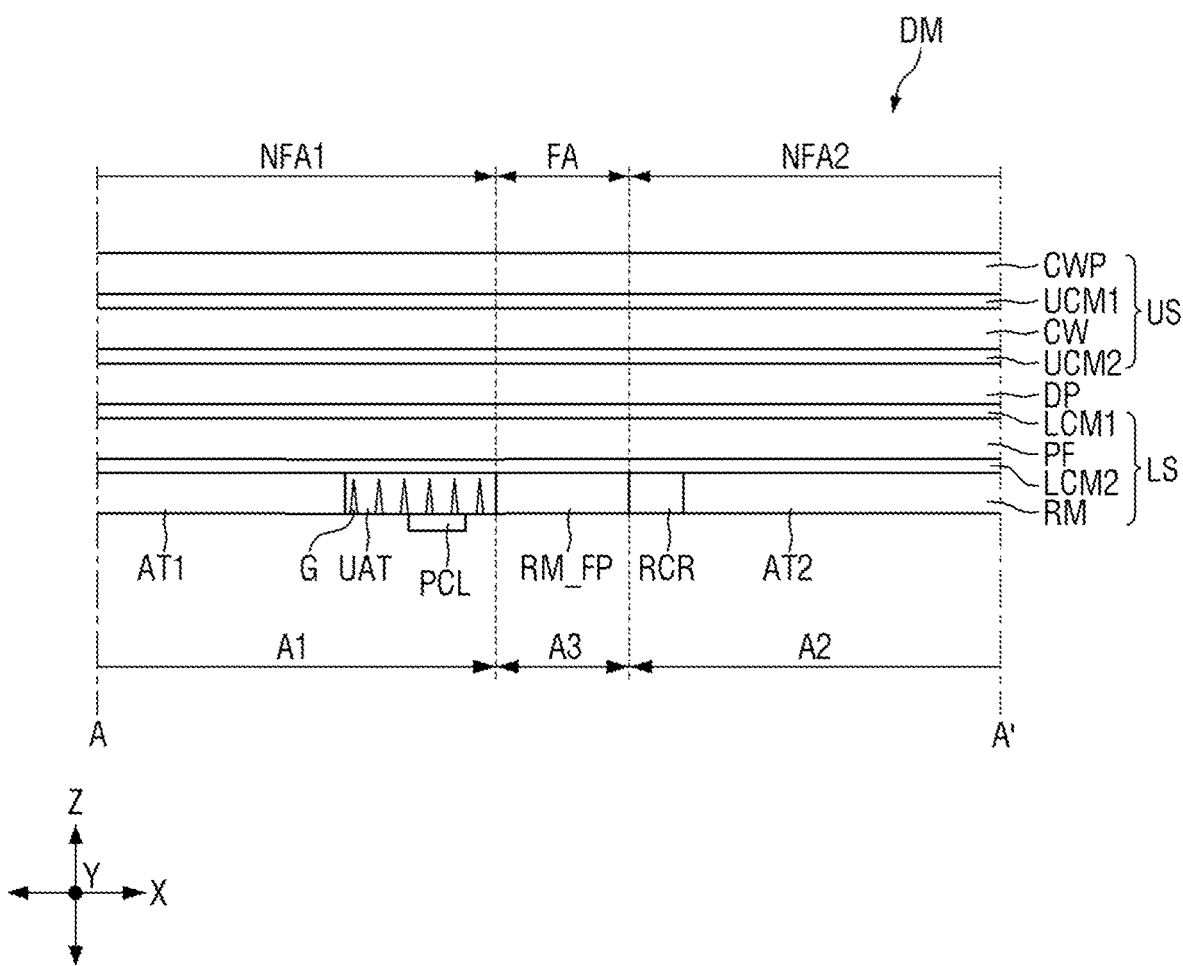
FIG. 4 is a schematic cross-sectional view of a display module cut along line A-A' in FIG. 1.
Figure 5:
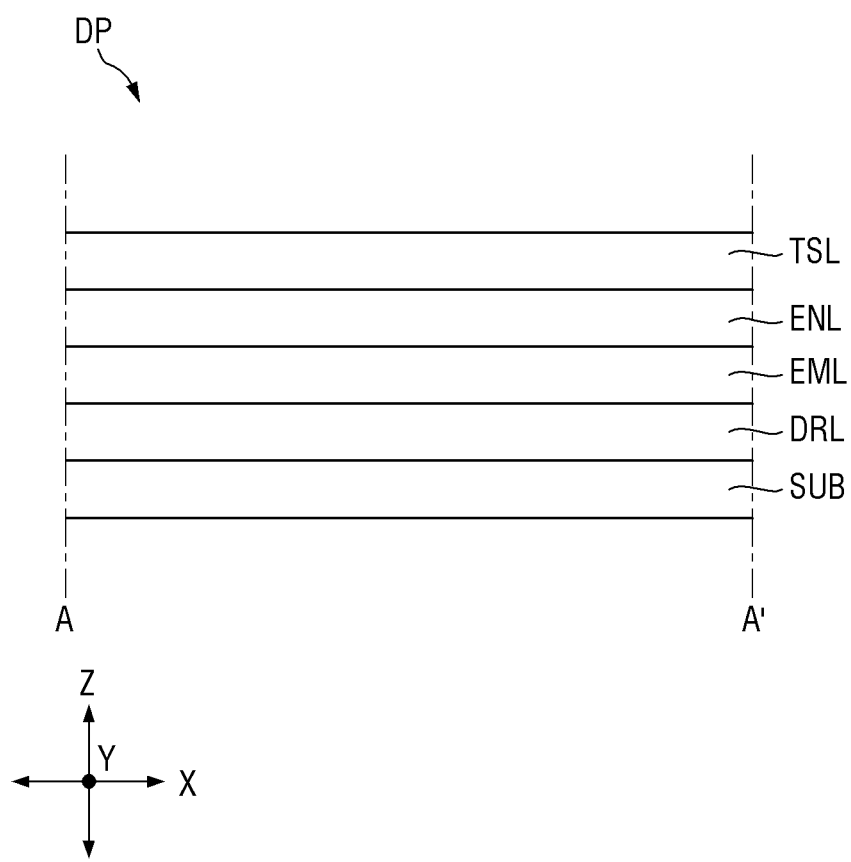
FIG. 5 is a schematic cross-sectional view of a display panel of FIG. 4.

FIG. 4 is a schematic cross-sectional view of the display module cut along line A-A' in FIG. 1. FIG. 5 is a schematic cross-sectional view of a display panel of FIG. 4.

Referring to FIG. 4, the display device 1 may include a display panel DP, an upper stack structure US stacked on a top face of the display panel DP, and a lower stack structure LS stacked on a bottom face of the display panel DP. The upper stack structure US and the lower stack structure LS may be referred to as a first stack structure and a second stack structure, respectively.

The top face of the display panel DP may act as a face on which a still image or a moving picture is displayed, and the bottom face of the display panel DP may be an opposite face to the top face thereof.

As shown in FIG. 4, the display panel DP, the upper stack structure US, and the lower stack structure LS may continuously extend along the first non-folding area NFA1, the folding area FA, and the second non-folding area NFA2.

However, the disclosure is not limited thereto. At least one of members constituting the upper stack structure US and the lower stack structure LS may be discontinuous or be absent in the folding area FA. Thus, stress generated in case that the display device 1 is folded may be reduced.

The display panel DP may display an image and may include a self-light emitting panel such as an organic light-emitting display panel (OLED), an inorganic light-emitting display panel (inorganic EL), a quantum dot light-emitting display panel (QED), a micro LED display panel (micro-LED), a nano LED display panel (nano-LED), a plasma display panel (PDP), a field emission display panel (FED), a cathode ray display panel (CRT), and a non-self-light emitting panel such as a liquid crystal display panel (LCD), and an electrophoresis display panel (EPD).

The display panel DP may further include a touch member. The touch member may be provided as a separate panel or film from the display panel DP and may be attached to the display panel DP. As another example, the touch member may be provided in a form of a touch layer inside the display panel DP. A following embodiment provides as an example a case where the touch member is provided inside the display panel DP and is included in the display panel DP. However, the disclosure is not limited thereto.

Referring to FIG. 5, the display panel DP may include a substrate SUB, a driver circuit layer DRL on the substrate SUB, a light-emissive layer EML on the driver circuit layer DRL, an encapsulation layer ENL on the light-emissive layer EML, and a touch layer TSL on the encapsulation layer ENL.

The substrate SUB may be embodied as a flexible substrate including a flexible polymer material such as polyimide. Accordingly, the display panel DP may be curved, bent, folded, or rolled.

The driver circuit layer DRL may be disposed on a top face of the substrate SUB. The driver circuit layer DRL may include a circuit that drives the light-emissive layer EML of a pixel. The driver circuit layer DRL may include thin-film transistors.

The light-emissive layer EML may be disposed on a top face of the driver circuit layer DRL. The light-emissive layer EML may include an organic light-emissive layer. The light-emissive layer EML may emit light at various luminance levels based on a driving signal transmitted from the driver circuit layer DRL.

The encapsulation layer ENL may be disposed on a top face of the light-emissive layer EML. The encapsulation layer ENL may include an inorganic film or a stack of an inorganic film and an organic film.

The touch layer TSL may be disposed on a top face of the encapsulation layer ENL. The touch layer TSL may recognize a touch input and may perform a function of the touch member. The touch layer TSL may include detecting areas and detecting electrodes.

Referring back to FIG. 4, the upper stack structure US may include a cover window CW and a cover window protecting layer CWP which may be sequentially stacked upward on the display panel DP.

The cover window CW may be disposed on a top face of the display panel DP. The cover window CW serves to protect the display panel DP. The cover window CW may be made of a transparent material. The cover window CW may be made of, for example, glass or plastic. In an embodiment, the cover window CW may be made of glass. However, the disclosure is not limited thereto.

The cover window protecting layer CWP may be disposed on a top face of the cover window CW. The cover window protecting layer CWP may be embodied as, for example, a transparent polymer film including at least one of PET (PolyEthylene Terephthalate), PEN (PolyEthylene Naphthalate), PES (Polyether Sulfone), PI (Polylmide), PAR (PolyARylate), PC (PolyCarbonate), PMMA (PolyMethyl MethAcrylate), or COC (CycloOlefin Copolymer) resin.

The cover window protecting layer CWP may include at least one of an AF (Anti-Fingerprint) coating layer and an AS (Anti-Static) coating layer. The cover window protecting layer CWP may function as at least one of the AF (Anti-Fingerprint) coating layer and the AS (Anti-Static) coating layer. Each of the AF (Anti-Fingerprint) coating layer and the AS (Anti-Static) coating layer may be embodied as a single layer or as multiple layers.

The cover window protecting layer CWP may include at least one of a material for anti-fingerprint ability or a material for anti-static ability. For example, the material for anti-fingerprint ability may include fluorine-based materials. In another example, the material for anti-static ability may include a non-conductive polymer containing a conductive additive such as metal particles such as aluminum particles, carbon black, or a surfactant that exhibits ion conductivity in case of reacting with moisture, or a conductive polymer with its own conductivity. However, the material for anti-fingerprint ability or the material for anti-static ability is not limited thereto.

Although not shown in the drawings, in some embodiments, the upper stack structure US of the light-emitting display panel may further include a polarizing member disposed between the display panel DP and the cover window CW. The polarizing member may serve to polarize light passing therethrough, thereby reducing reflection of external light. The polarizing member may be embodied as a polarizing film. However, the disclosure is not limited thereto.

The upper stack structure US may include upper bonding members UCM1 and UCM2 that may bond adjacently stacked members to each other.

Each of the upper bonding members UCM1 and UCM2 may be optically transparent. Each of the upper bonding members UCM1 and UCM2 may include an optically transparent adhesive, an optically transparent resin, or a pressure-sensitive adhesive.

In an embodiment, a first upper bonding member UCM1 may be disposed between the cover window protecting layer CWP and the cover window CW and bond the cover window protecting layer CWP and the cover window CW to each other. A second upper bonding member UCM2 may be disposed between the cover window CW and the display panel DP and bond cover window CW and the display panel DP to each other.

The lower stack structure LS may include a polymer film layer PF, a bottom layer RM, and a protective coating layer PCL which may be sequentially stacked downward on a bottom face of the display panel DP.

The polymer film layer PF may be disposed on a bottom face of the display panel DP. The polymer film layer PF may function to protect the display panel DP. The polymer film layer PF may include, for example, polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), or cycloolefin polymer (COP).

The bottom layer RM may be disposed on a bottom face of the polymer film layer. The bottom layer RM may extend along the first non-folding area NFA1, the folding area FA, and the second non-folding area NFA2. The bottom layer RM may support a structure stacked on a top face of the bottom layer RM.

The bottom layer RM may be the lowest layer among the layers disposed on a bottom face of the display panel DP, except for the protective coating layer PCL. The lowest layer may mean the outermost layer spaced as far as possible from the bottom face of the display panel DP in the thickness direction, except for the protective coating layer PCL.

A bottom face of the protective coating layer PCL and a bottom face of the bottom layer RM may act as the bottom face of the display module DM. In this case, the bottom face of the bottom layer RM may act as most of the bottom face of the display module DM. As will be described later, at least a portion of the bottom face of the bottom layer RM may be exposed to a support member SF.

In an embodiment, the bottom layer RM may be embodied as a single layer that may continuously extend along the first non-folding area NFA1, the folding area FA, and the second non-folding area NFA2. However, the disclosure is not limited thereto. In some embodiments, the bottom layer RM may be discontinuous in the folding area FA. In some embodiments, the bottom layer RM may be composed of multiple layers.

The bottom layer RM may include at least one functional layer. The functional layer may include, for example, at least one of a heat dissipation layer, a cushion layer (a shock absorption layer), a rigidity reinforcement layer, a digitizer, an electromagnetic wave shielding layer, and the like.

In an embodiment, the bottom layer RM may include metal. The bottom layer RM may be embodied as a metal plate. The bottom layer RM may function as a heat dissipation layer that may dissipate heat generated from the display panel DP or other portions of the display device 1. The metal may include a metal having excellent thermal conductivity, for example, copper, nickel, ferrite, or silver, or an alloy of at least two thereof. However, the disclosure is not limited thereto.

In some embodiments, the bottom layer RM may include, for example, a polymer resin such as polyurethane, polycarbonate, polypropylene, polyethylene, and the like. In some embodiments, the bottom layer RM may include a material having elasticity, such as rubber, silicone, or a synthetic sponge formed by foam molding a urethane-based material, or an acrylic-based material. In some embodiments, the bottom layer RM may function as a cushioning layer that absorbs or mitigates an external shock.

In some embodiments, the bottom layer RM may further include a light absorbing material such as black pigment or black dye. In some embodiments, the bottom layer RM may function as a light blocking layer that prevents components disposed under the bottom layer RM from being visually recognized from the outside.

The bottom layer RM may include a first area A1, a second area A2, and a third area A3 disposed therebetween.

The first area A1 may be mainly disposed in the first non-folding area NFA1, the second area A2 may be mainly disposed in the second non-folding area NFA2, and the third area A3 may be mainly disposed in the folding area FA. The first area A1 and the second area A2 may be connected to each other via the third area A3. The first area A1 may be connected to a side of the third area A3 adjacent to the first non-folding area NFA1. The second area A2 may be connected to an opposite side of the third area A3 adjacent to the second non-folding area NFA2.

In an embodiment, the first area A1, the second area A2, and the third area A3 may be integrally connected to each other and may continuously extend along the first non-folding area NFA1, the folding area FA, and the second non-folding area NFA2. For example, the bottom layer RM may be composed of (or include) a continuous member. However, the disclosure is not limited thereto. In some embodiments, at least two of the first area A1, the second area A2, and the third area A3 may be spaced from each other. In some embodiments, the third area A3 may be omitted, and the first area A1 and the second area A2 may be disposed in the first non-folding area NFA1 and the second non-folding area NFA2, respectively.

A boundary between the first area A1 and the third area A3 may be positioned adjacent to a boundary between the folding area FA and the first non-folding area NFA1. A boundary between the second area A2 and the third area A3 may be positioned adjacent to a boundary between the folding area FA and the second non-folding area NFA2.

As shown in FIG. 4, a boundary of the third area A3 (the boundary between the first area A1 and the third area A3) and an opposite boundary of the third area A3 (the boundary between the second area A2 and the third area A3) may be respectively aligned, in the thickness direction, with a boundary of the folding area FA (the boundary between the folding area FA and the first non-folding area NFA1) and an opposite boundary of the folding area FA (the boundary between folding area FA and the second non-folding area NFA2). However, the disclosure is not limited thereto. In some embodiment, the boundaries between the first area A1, the second area A2, and the third area A3 may not be aligned, in the thickness direction, with the boundaries between the folding area FA, the first non-folding area NFA1, and the second non-folding area NFA2.

In case that the display device 1 switches from one state to another state, the boundaries of the third area A3 and the boundaries of the folding area FA, and furthermore, relative positions of regions or portions constituting each of the third area A3 and the folding area FA may be fixed or may vary. For example, in the first state, the boundaries of the third area A3 and the boundaries of the folding area FA may be aligned with each other in the thickness direction in a cross sectional view. However, in each of the second state and the third state, the boundaries of the third area A3 and the boundaries of the folding area FA may be not aligned with each other in the thickness direction in a cross sectional view. In another example, in each of the first state and the third state, the boundaries of the third area A3 and the boundaries of the folding area FA may be not aligned with each other in the thickness direction in a cross sectional view. However, in the second state, the boundaries of the third area A3 and the boundaries of the folding area FA may be aligned with each other in the thickness direction in a cross sectional view. For still another example, in each of the first state, the second state, and the third state, the boundaries of the third area A3 and the boundaries of the folding area FA may not be aligned with each other in the thickness direction in a cross sectional view.

The first area A1 may include a first attached portion AT1 attached to the support member SF, and a non-attached portion UAT not attached to the support member SF. The second area A2 may include a second attached portion AT2 attached to the support member SF, and a reversely bent portion RCR that is bent in an opposite direction to a direction in which a bent portion DP_CV of the display panel DP is bent in case that the slidable member SLM slides. The third area A3 may include a flexible portion RM_FP that is bent in case that the display device 1 is folded.

Hereinafter, for convenience of description referring to FIG. 4 to FIG. 11, a boundary of each of the first attached portion AT1, the non-attached portion UAT, the second attached portion AT2, the reversely bent portion RCR, and the flexible portion RM_FP is shown using a solid line. However, the disclosure is not limited thereto. In an embodiment, each of the first attached portion AT1, the non-attached portion UAT, the second attached portion AT2, the reversely bent portion RCR, and the flexible portion RM_FP may be a specific portion or a specific area of the bottom layer RM. In some embodiments, at least one of the first attached portion AT1, the non-attached portion UAT, the second attached portion AT2, the reversely bent portion RCR, and the flexible portion RM_FP of the bottom layer RM may be a separate member distinct from the remaining portions thereof.

The first attached portion AT1 and the non-attached portion UAT may be mainly disposed in the first non-folding area NFA1.

The non-attached portion UAT may be disposed between the first attached portion AT1 and the flexible portion RM_FP. The non-attached portion UAT may connect the first attached portion AT1 and the flexible portion RM_FP to each other. The non-attached portion UAT may be closer to the folding area FA than the first attached portion AT1 may be. A spacing between the first attached portion AT1 and the folding area FA may be larger than a spacing between the non-attached portion UAT and the folding area FA.

A size of the non-attached portion UAT may be smaller than that of the first attached portion AT1. For example, an area of the non-attached portion UAT in a plan view or a length in the first direction X of the non-attached portion UAT in the first state may be smaller than that of the first attached portion AT1. However, the disclosure is not limited thereto. The size of the non-attached portion UAT may be greater than or equal to that of the first attached portion AT1.

The size of the non-attached portion UAT may be greater than or equal to that of the flexible portion RM_FP. For example, the area of the non-attached portion UAT in a plan view or the length in the first direction X of the non-attached portion UAT in the first state may be greater than or equal to that of the flexible portion RM_FP. However, the disclosure is not limited thereto. The size of the non-attached portion UAT may be greater than or equal to that of the flexible portion RM_FP.

A pattern for reducing bending resistance may be formed in the non-attached portion UAT. The non-attached portion UAT may include grooves G formed in a bottom face thereof and recessed toward a top face thereof. A width of the groove G may gradually decrease as the groove extends toward the top face of the non-attached portion UAT in a cross-sectional view. However, the cross-sectional shape of the groove G is not limited thereto. In some embodiments, a pattern for reducing the bending resistance may be omitted. In some embodiments, the non-attached portion UAT may include holes. In some embodiments, the pattern may be further formed in the flexible portion RM_FP.

As shown in FIG. 4, a boundary between the non-attached portion UAT and the flexible portion RM_FP may be aligned with a boundary of the folding area FA in the thickness direction. However, the disclosure is not limited thereto. The boundary between the non-attached portion UAT and the flexible portion RM_FP may be positioned within the folding area FA or within the first non-folding area NFA1, or within the first area A1 or within the third area A3.

The second attached portion AT2 and the reversely bent portion RCR may be mainly disposed in the second non-folding area NFA2.

The second attached portion AT2 may refer to a portion of the bottom layer RM fixedly attached to the slidable member SLM. The second attached portion AT2 may be attached to the slidable member SLM via a second adhesive member AD2.

The reversely bent portion RCR may be disposed between the second attached portion AT2 and the flexible portion RM_FP. The reversely bent portion RCR may connect the second attached portion AT2 and the flexible portion RM_FP to each other. The reversely bent portion RCR may be closer to the folding area FA than the second attached portion AT2 may be. A spacing between the second attached portion AT2 and the folding area FA may be larger than a spacing between the reversely bent portion RCR and the folding area FA. As shown in FIGS. 6 to 9, the reversely bent portion RCR may extend along an edge portion of the slidable member SLM adjacent to the hinge member HG (facing the hinge member HG) in a cross-sectional view.

A size of the reversely bent portion RCR may be smaller than that of the second attached portion AT2. For example, an area of the reversely bent portion RCR in a plan view or a length in the first direction X of the reversely bent portion RCR in the first state may be smaller than that of the second attached portion AT2. However, the disclosure is not limited thereto. The size of the reversely bent portion RCR may be greater than or equal to that of the second attached portion AT2.

The size of the reversely bent portion RCR may be greater than or equal to that of the flexible portion RM_FP. For example, the area of the reversely bent portion RCR in a plan view or the length in the first direction X of the reversely bent portion RCR in the first state may be greater than or equal to that of the flexible portion RM_FP. However, the disclosure is not limited thereto. The size of the reversely bent portion RCR may be greater than or equal to that of the flexible portion RM_FP. A portion of the reversely bent portion RCR adjacent to the second attached portion AT2 may be adhered or bonded to the slidable member SLM via a second adhesive member AD2. However, the disclosure is not limited thereto.

The size of the reversely bent portion RCR may be smaller than or equal to a size of the non-attached portion UAT. For example, the area of the reversely bent portion RCR in a plan view or the length in the first direction X of the reversely bent portion RCR in the first state may be greater than or equal to that of the non-attached portion UAT. However, the disclosure is not limited thereto. The size of the reversely bent portion RCR may be larger than that of the non-attached portion UAT.

As shown in FIG. 4, a boundary between the reversely bent portion RCR and the flexible portion RM_FP may be aligned with the opposite boundary of the folding area FA in the thickness direction. However, the disclosure is not limited thereto. The boundary between the reversely bent portion RCR and the flexible portion RM_FP may be positioned within the folding area FA or within the second non-folding area NFA2, or within the second area A2 or within the third area A3.

The flexible portion RM_FP may be mainly disposed in the folding area FA. The flexible portion RM_FP may be disposed between the non-attached portion UAT and the reversely bent portion RCR. The flexible portion RM_FP may extend the non-attached portion UAT and the reversely bent portion RCR to each other. In some embodiments, a pattern for reducing stress applied to the bottom layer RM in case that the display device 1 is folded or slides may be formed in the flexible portion RM_FP. In some embodiments, the flexible portion RM_FP may be omitted.

The protective coating layer PCL may be disposed on a bottom face of the bottom layer RM. The protective coating layer PCL may be disposed in the first area A1 of the bottom layer RM. The protective coating layer PCL may be disposed on the non-attached portion UAT. In some embodiments, the protective coating layer PCL may further have a portion disposed in the third area A3 thereof or the flexible portion RM_FP. In some embodiments, the protective coating layer PCL may be further disposed in the second area A2 or the reversely bent portion RCR. The protective coating layer PCL may be formed on a bottom face of the non-attached portion UAT by using various processes such as a deposition process, a dry etching process, or a wet etching process, using a mask.

A size of the protective coating layer PCL may be smaller than or equal to that of the non-attached portion UAT. For example, an area of the protective coating layer PCL in a plan view or a length in the first direction X of the protective coating layer PCL in the first state may be greater than or equal to that of the non-attached portion UAT. The protective coating layer PCL may be disposed to cover (or overlap) a portion of the bottom face of the non-attached portion UAT. However, the disclosure is not limited thereto. The size of the protective coating layer PCL may be larger than that of the non-attached portion UAT.

In an embodiment, the protective coating layer PCL may be closer to a boundary between the non-attached portion UAT and the flexible portion RM_FP than to a boundary between the first attached portion AT1 and the non-attached portion UAT in a cross-sectional view. However, the disclosure is not limited thereto. In some embodiments, the protective coating layer PCL may overlap a central portion of the non-attached portion UAT in a cross-sectional view. The protective coating layer PCL may be closer to the boundary between the first attached portion AT1 and the non-attached portion UAT than to the boundary between the non-attached portion UAT and the flexible portion RM_FP in a cross-sectional view.

A thickness of the protective coating layer PCL may be smaller than or equal to that of the non-attached portion UAT. For example, the thickness of the protective coating layer PCL may be in a range of about 0.5 nm to about 100 nm. However, the disclosure is not limited thereto. The thickness of the protective coating layer PCL may be greater than that of the non-attached portion UAT.

The protective coating layer PCL may have at least one of slip ability to reduce friction generated in case that the display module DM and the support member SF contact each other and antistatic ability to prevent generation of static electricity in case that the display module DM and the support member SF contact each other. The slip ability and the antistatic ability may be implemented using a single layer, or may be implemented using multiple layers.

In an embodiment, the protective coating layer PCL may be embodied as a single layer which may perform both the anti-fingerprint and anti-static functions. However, the disclosure is not limited thereto. In some embodiments, the protective coating layer PCL may include multiple layers. In this case, the layers may have anti-fingerprint ability, slip ability and electrostatic prevention ability, respectively. However, the disclosure is not limited thereto.

The protective coating layer PCL may include at least one of a material for the slip ability and a material for the antistatic ability. The material for the slip ability may be the same or similar to the material for the anti-fingerprint ability. However, the disclosure is not limited thereto.

For example, the material for the slip ability may include fluorine-based materials. For another example, the material for the antistatic ability may include a non-conductive polymer containing a conductive additive such as metal particles such as aluminum particles, carbon black, or a surfactant that exhibits ion conductivity in case of reacting with moisture, or a conductive polymer with its own conductivity.

In some embodiments, the protective coating layer PCL, and the cover window protecting layer CWP or at least one of multiple layers constituting the cover window protecting layer CWP may include substantially a same or similar material. The protective coating layer PCL and the cover window protecting layer CWP may include substantially a same or similar material to achieve the anti-fingerprint ability or the antistatic ability of the cover window protecting layer CWP. However, the material for the anti-fingerprint ability or the material for the antistatic ability is not limited thereto. The lower stack structure LS may further include lower bonding members LCM1 and LCM2, for example, first and second lower bonding members LCM1 and LCM2, that may bond adjacently stacked members to each other. For example, a first lower bonding member LCM1 may be disposed between the display panel DP and the polymer film layer PF to bond the display panel DP and the polymer film layer PF to each other. A second lower bonding member LCM may be disposed between the polymer film layer PF and the bottom layer RM to bond the polymer film layer PF and the bottom layer RM to each other. Although not shown in the drawings, in some embodiments, a bonding member may be further disposed between the protective coating layer PCL and the bottom layer RM to bond the protective coating layer PCL and the bottom layer RM to each other.

Figure 6:
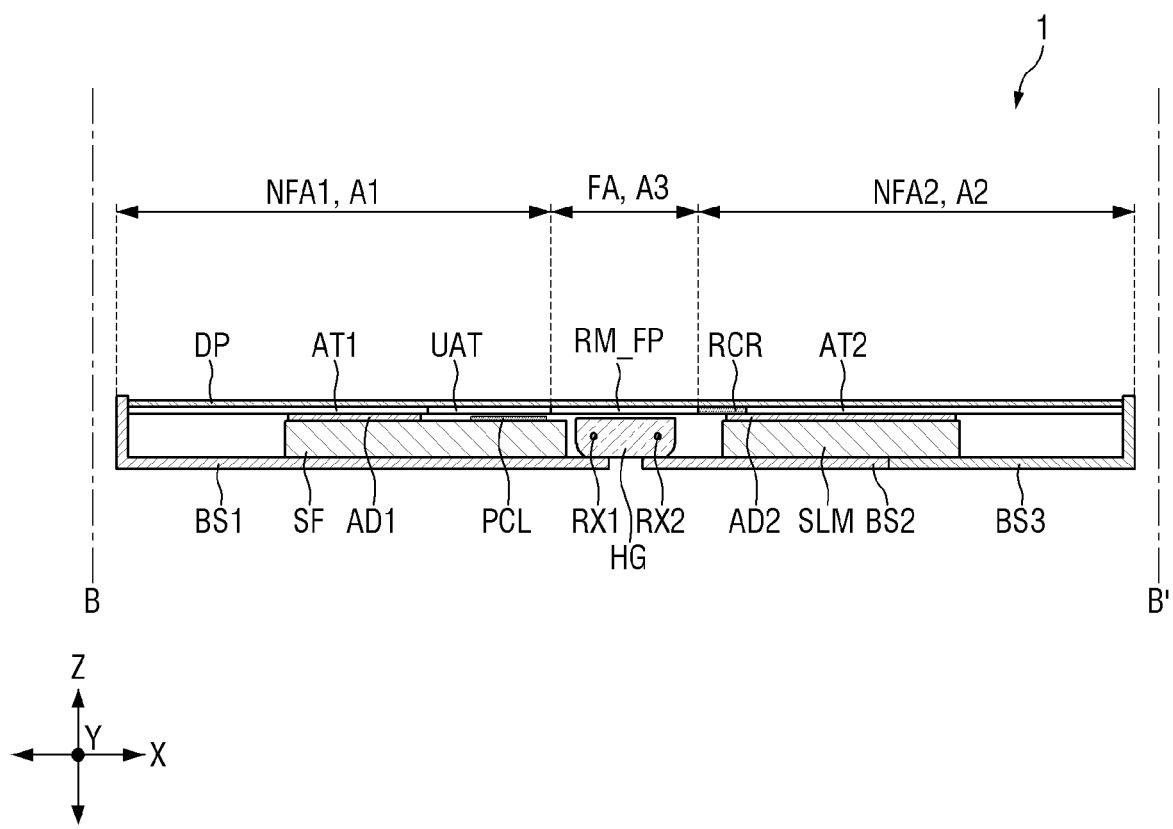
FIG. 6 is a schematic cross-sectional view taken along line B-B' in FIG. 1.
Figure 7:
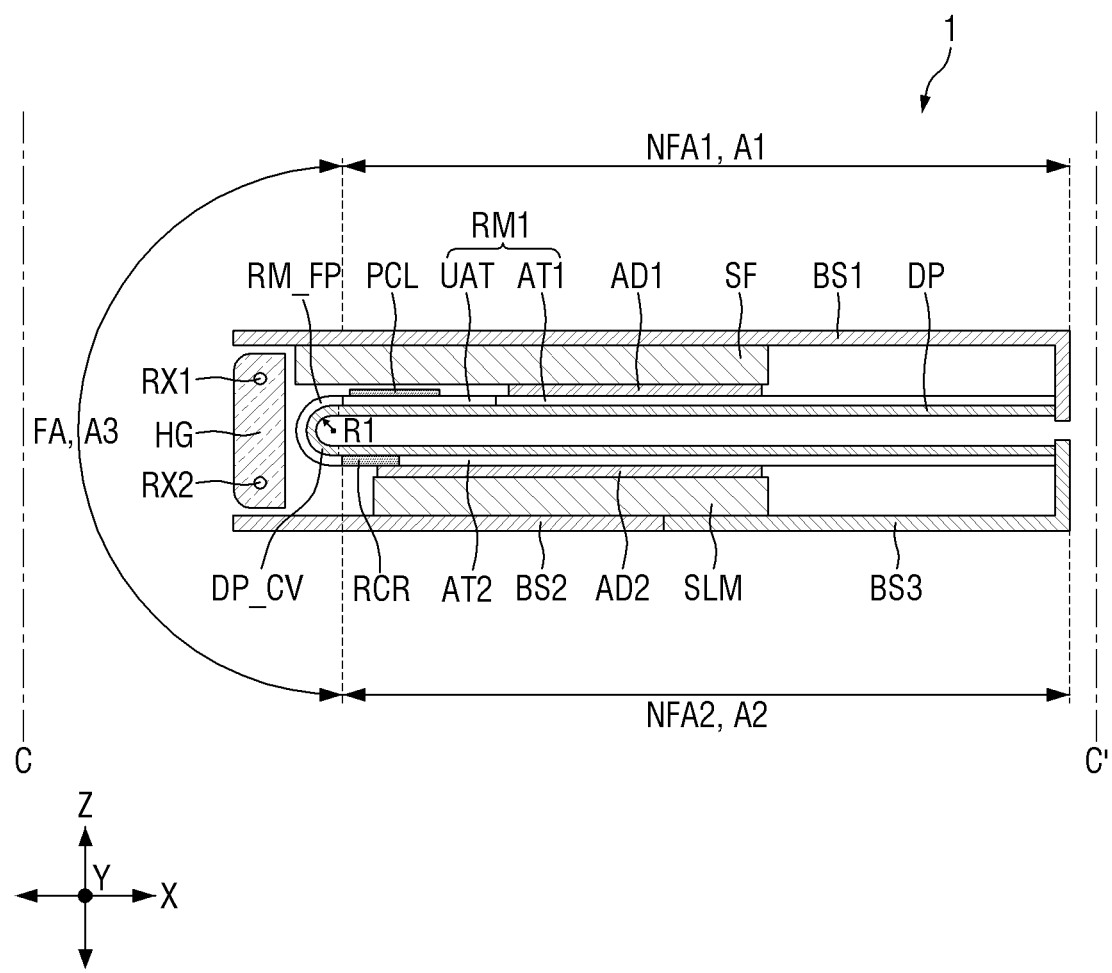
FIG. 7 is a schematic cross-sectional view taken along line C-C' in FIG. 2.
Figure 8:
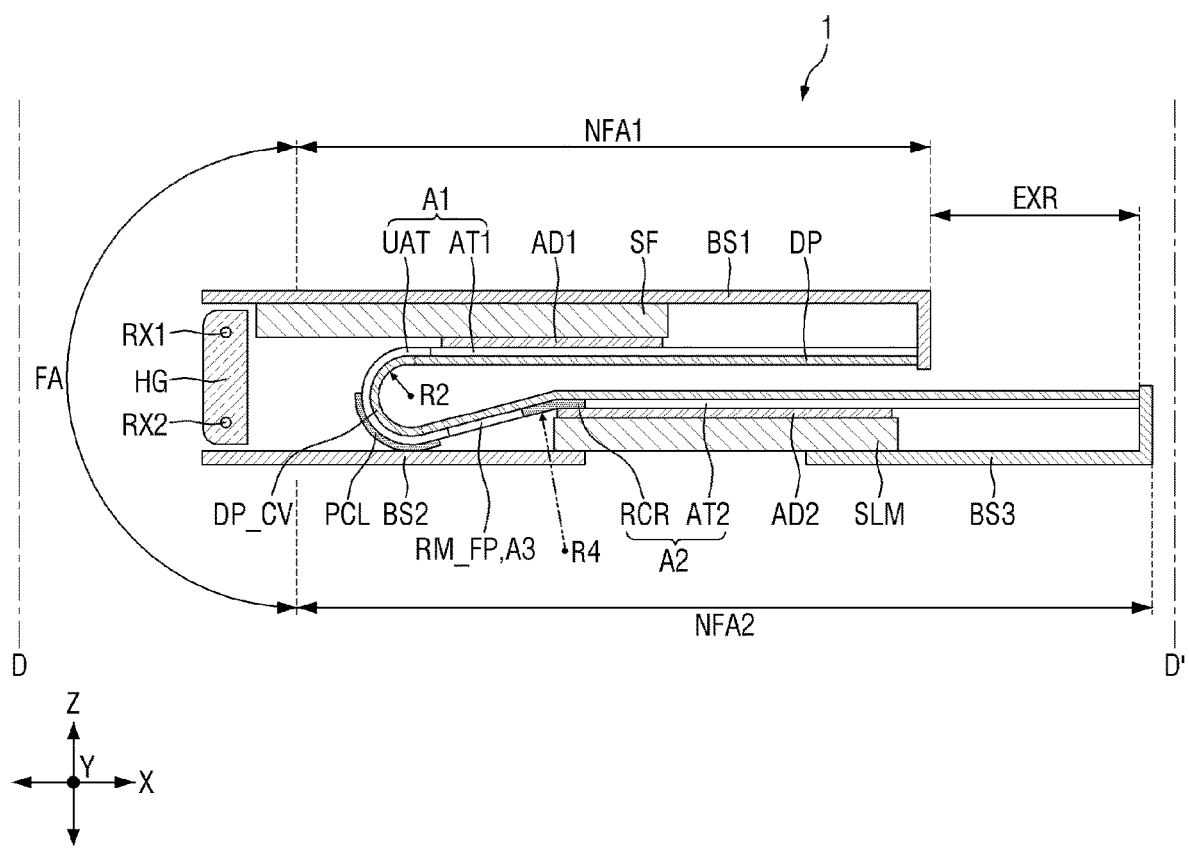
FIG. 8 is a schematic cross-sectional view taken along line D-D' in FIG. 3.
Figure 9:
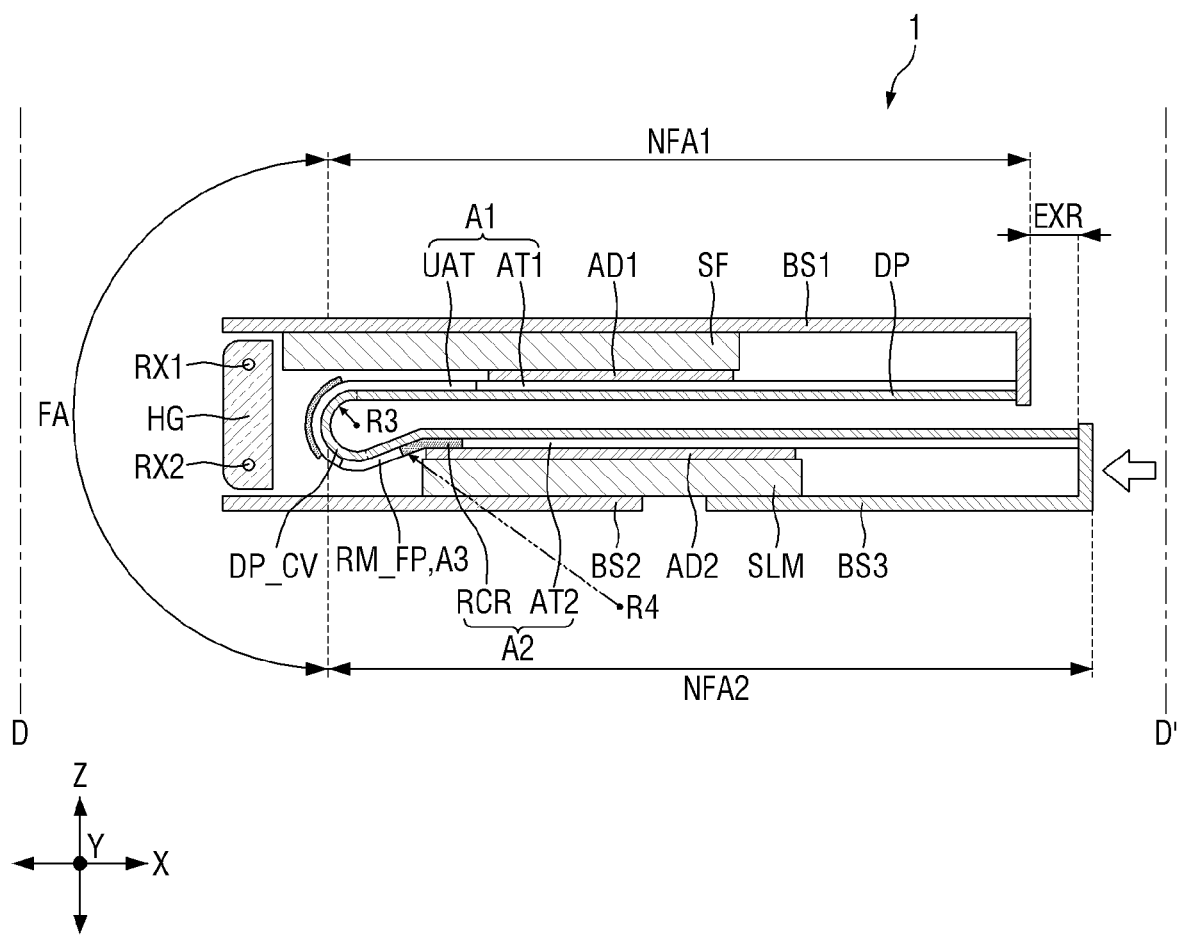
FIG. 9 is a schematic cross-sectional view of a display device according to an embodiment during a transition from the third state to the second state.

FIG. 6 is a schematic cross-sectional view taken along line B-B' in FIG. 1. FIG. 7 is a schematic cross-sectional view taken along line C-C' in FIG. 2. FIG. 8 is a schematic cross-sectional view taken along line D-D' in FIG. 3. FIG. 9 is a schematic cross-sectional view of a display device according to an embodiment while a state of the display device switches from the third state to the second state.

Hereinafter, for convenience of description referring to in FIG. 6 to FIG. 9, illustration of the members other than the display panel DP, the bottom layer RM, and protective coating layer PCL of the display module DM is omitted.

Hereinafter, descriptions mainly focus on the display panel DP and the bottom layer RM of the display module DM. The display panel DP or the bottom layer RM as described below may mean an entirety of the display module DM including the same or may mean at least one of the display panel DP, the upper stack structure US, and the lower stack structure LS.

Referring to FIGS. 6 to 9, as described above, the hinge member HG may be mainly disposed in the folding area FA. The first base member BS1 may be mainly disposed in the first non-folding area NFA1. The second base member BS2 and the third base member BS3 may be mainly disposed in the second non-folding area NFA2.

The hinge member HG may provide a first pivoting axis RX1 and a second pivoting axis RX2 that may be spaced apart from each other and extend in the second direction Y. As shown in FIGS. 7 and 8, the first base member BS1 may pivot around the first pivoting axis RX1, and the second base member BS2 may pivot around the second pivoting axis RX2. The third base member BS3 may be connected to the second base member BS2 via another member such as the slidable member SLM. The third base member BS3 may pivot together with the second base member BS2 around the second pivoting axis RX2. Although not shown in the drawings, each of the first pivoting axis RX1 and the second pivoting axis RX2 may be a virtual axis positioned outside the hinge member HG.

As shown in FIGS. 6 to 9, each of the first base member BS1, the second base member BS2, and the third base member BS3 may have an inner space recessed in the thickness direction. The inner spaces thereof may respectively receive therein the support member SF, the hinge member HG, and the slidable member SLM. However, a shape of each of the first base member BS1, the second base member BS2, and the third base member BS3 is not limited thereto.

Referring to FIGS. 6 to 9, the display device 1 may further include the support member SF, the slidable member SLM, a first adhesive member AD1, and the second adhesive member AD2 disposed on a bottom face of the display module DM.

The support member SF may be mainly disposed in the first non-folding area NFA1. The support member SF may be interposed between the first area A1 and the first base member BS1.

The support member SF may overlap the first attached portion AT1 and the non-attached portion UAT in the thickness direction. The first attached portion AT1 may be attached to the support member SF. However, the non-attached portion UAT may not be attached to the support member SF. The non-attached portion UAT may be disposed on a top face of the support member SF and may not be attached to the support member SF. The non-attached portion UAT may be disposed on the top face of the support member SF and may be seated on the support member SF in the first state and the second state, and may be spaced apart from the support member SF and may be bent in the third state. In FIGS. 6 to 9, the non-attached portion UAT is spaced apart from the support member SF. However, the disclosure is not limited thereto. The non-attached portion UAT may be disposed to contact the support member SF.

The first adhesive member AD1 may be interposed between the first attached portion AT1 and the support member SF. The first adhesive member AD1 may directly contact the first attached portion AT1 and the support member SF. The first adhesive member AD1 may overlap at least a portion of the first attached portion AT1 and the support member SF in the thickness direction.

The first adhesive member AD1 may not be interposed between the non-attached portion UAT and the support member SF. The first adhesive member AD1 may be spaced apart from the non-attached portion UAT and the protective coating layer PCL and may not overlap the non-attached portion UAT and the protective coating layer PCL in the thickness direction. For example, the first adhesive member AD1 may be interposed only between the first attached portion AT1 and the support member SF.

The first adhesive member AD1 may be positioned in the first area A1 and may be spaced apart from the protective coating layer PCL in the first direction X, a radial direction of the first pivoting axis RX1, or a radial direction of the second pivoting axis RX2. However, the disclosure is not limited thereto. The protective coating layer PCL may contact the first adhesive member AD1.

The radius direction may mean a direction which intersects the first pivoting axis RX1 or the second pivoting axis RX2, and which goes away from or goes toward the first pivoting axis RX1 and/or the second pivoting axis RX2. The radial direction may be perpendicular to the first pivoting axis RX1 or the second pivoting axis RX2. However, the disclosure is not limited thereto.

The slidable member SLM may be mainly disposed in the second non-folding area NFA2. The slidable member SLM may be interposed between the second base member BS2 and the bottom layer RM and between the third base member BS3 and the bottom layer RM.

The slidable member SLM may overlap the second attached portion AT2 in the thickness direction. The second attached portion AT2 may be fixedly attached to the slidable member SLM. The slidable member SLM may overlap a portion of the reversely bent portion RCR in the thickness direction. The portion of the reversely bent portion RCR may be fixedly attached to the slidable member SLM. However, the disclosure is not limited thereto.

The slidable member SLM may extend the second base member BS2 and the third base member BS3 to each other so that a spacing between the second base member BS2 and the third base member BS3 is variable. The spacing may be a dimension in the first direction X, the radial direction of the first pivoting axis RX1, or the second pivoting axis RX2. However, the disclosure is not limited thereto.

As shown in FIGS. 7 to 9, the slidable member SLM may be disposed to be movable relative to the hinge member HG and/or the second base member BS2. The slidable member SLM may be fixed to the display module DM and/or the third base member BS3. In case that the slidable member SLM slides, the display module DM and/or the third base member BS3 may move relative to the hinge member HG and/or the second base member BS2.

A side of the slidable member SLM facing toward the hinge member HG may be slidably connected to the second base member BS2, and an opposite side of the slidable member SLM opposite to the side of the slidable member SLM is fixed to the third base member BS3. A top face of the slidable member SLM may be fixed to a bottom face of the display module DM. For example, in FIGS. 6 to 9, the side and the opposite side of the slidable member SLM may be a left side of the slidable member SLM overlapping the second base member BS2 and a right side of the slidable member SLM overlapping the third base member BS3, respectively.

A side of each of the slidable member SLM, the third base member BS3, and the display module DM may move away from or closer toward the hinge member HG, the first pivoting axis RX1, and/or the second pivoting axis RX2. For example, a side of each of the slidable member SLM, the third base member BS3, and the display module DM may move approximately in the radial direction of the first pivoting axis RX1 and/or the second pivoting axis RX2. However, the disclosure is not limited thereto. A side of the display module DM may include an edge of the display module DM disposed in the second non-folding area NFA2 and a portion of the display module DM adjacent thereto.

As shown in FIGS. 6 and 7, a spacing between the slidable member SLM and the hinge member HG may be larger than a spacing between the support member SF and the hinge member HG. Specifically, a spacing between a side of the slidable member SLM facing toward the hinge member HG and the hinge member HG may be larger than a side of the support member SF facing toward the hinge member HG and the hinge member HG. Accordingly, as shown in FIGS. 7 and 8, a space may be secured between the bottom layer RM and the second base member BS2 to allow the display panel DP and the bottom layer RM to be deformed such that a radius of curvature of each of the display panel DP and the bottom layer RM increases, during slide movement of the display device 1. However, the disclosure is not limited thereto. The spacing between the slidable member SLM and the hinge member HG may be equal to the spacing between the support member SF and the hinge member HG.

The second adhesive member AD2 may be interposed between the second area A2 and the slidable member SLM. The second adhesive member AD2 may overlap the second area A2 and the slidable member SLM in the thickness direction. The second adhesive member AD2 may directly contact the second area A2 and the slidable member SLM. The second adhesive member AD2 may be interposed between the second attached portion AT2 and the slidable member SLM. The second adhesive member AD2 may overlap the second attached portion AT2 in the thickness direction.

The second adhesive member AD2 may be further disposed between the slidable member SLM and a portion of the reversely bent portion RCR overlapping the slidable member SLM in the thickness direction. The second adhesive member AD2 may overlap a portion of the reversely bent portion RCR in the thickness direction. The second adhesive member AD2 may directly contact the reversely bent portion RCR. However, the disclosure is not limited thereto. The second adhesive member AD2 may be interposed only between the slidable member SLM and the second attached portion AT2.

As shown in FIGS. 6 and 7, in each of the first state and the second state, the slidable member SLM may be accommodated in the second base member BS2 and the third base member BS3 and thus may not be exposed to the outside.

As shown in FIG. 8, in the third state, a portion of the slidable member SLM between the second base member BS2 and the third base member BS3 may be exposed to the outside. In the third state, a portion of the display panel DP positioned in the second non-folding area NFA2 may move together with the slidable member SLM and thus may define an exposed area EXR exposed to the outside.

Referring to FIGS. 7 and 8, the display panel DP may be bent to have a predefined curvature in each of the second state and the third state. Hereinafter, for convenience of description, a portion of the display panel DP that is bent in case that the display device 1 is folded or slides will be referred to as the bent portion DP_CV.

As shown in FIG. 7, in the second state, an edge of the display panel DP disposed in the first non-folding area NFA1 may be aligned with an opposite edge of the display panel DP disposed in the second non-folding area NFA2 in the thickness direction.

Referring to FIGS. 7 to 9, in case that a state of the device switches from the second state to the third state or switches from the third state to the second state, a portion of the display panel DP positioned in the second non-folding area NFA2 may be attached to the slidable member SLM and thus may slide together with the slidable member SLM.

As shown in FIGS. 7 and 8, in case that a state of the device switches from the second state to the third state, the slidable member SLM may slide in one direction toward the opposite edge of the display panel DP in a cross sectional view.

The slidable member SLM may allow a portion of the display panel DP attached thereto to move in one direction toward the opposite edge of the display panel DP in a cross sectional view. The portion of the display panel DP may be pulled away from the hinge member HG, the first pivoting axis RX1, and/or the second pivoting axis RX2. In this case, the non-attached portion UAT may be bent so that a side thereof connected to the flexible portion RM_FP is away from the support member SF.

Conversely, as shown in FIGS. 8 and 9, in case that a state of the device switches from the third state to the second state, the slidable member SLM may slide in the opposite direction to one direction toward the opposite edge of the display panel DP in a cross sectional view. The portion of the display panel DP attached to the slidable member SLM may be pushed toward the hinge member HG, the first pivoting axis RX1, and/or the second pivoting axis RX2. In this case, the non-attached portion UAT may be unfolded to be flat while a side thereof connected to the flexible portion RM_FP closely contacts the support member SF. One direction and the opposite direction thereto may be included in the aforementioned radial direction. However, the disclosure is not limited thereto.

The portion of the display panel DP may be attached to the rigid slidable member SLM and may move integrally with the slidable member SLM. Accordingly, in case that the display device 1 switches from one state to another state, a curvature and a radius of curvature of the bent portion DP_CV may naturally change. Further, a buckling phenomenon of the display panel DP may be prevented, which may otherwise occur in case that the display panel DP alone is pushed toward the hinge member HG, the first pivoting axis RX1, and/or the second pivoting axis RX2 while the slidable member SLM is absent.

A spacing between the slidable member SLM and the hinge member HG may vary based on the state of the display device 1. In case that a state of the device switches from the second state to the third state, the slidable member SLM may move such that the spacing between the slidable member SLM and the hinge member HG increases. In case that a state of the device switches from the third state to the second state, the slidable member SLM may move such that the spacing between the slidable member SLM and the hinge member HG decreases.

In case that a state of the device switches from the second state to the third state or from the third state to the second state, a size of the inner space between the first base member BS1 and the second base member BS2 and a size of the bent portion DP_CV of the display panel DP may vary.

Specifically, the size of the inner space and the size of the bent portion DP_CV of the display panel DP may increase in case that a state of the device switches from the second state to the third state, and may decrease in case that a state of the device switches from the third state to the second state.

A first radius of curvature R1 of the bent portion DP_CV in the second state may be smaller than a second radius of curvature R2 of the bent portion DP_CV in the third state. For example, the second radius of curvature R2 may be in a range of about 3 to 4 times the first radius of curvature R1. In still another example, the first radius of curvature R1 may be in a range of about 0.5 mm to about 1.5 mm, while the second radius of curvature R2 may be in a range of about 1.5 mm to about 3.0 mm. However, the disclosure is not limited thereto.

While a state of the device switches from the second state to the third state or switches from the third state to the second state, the bent portion DP_CV may have a third radius of curvature R3 equal to or greater than the first radius of curvature R1 and equal to or smaller than the second radius of curvature R2. While a state of the device switches from the third state to the second state, the third radius of curvature R3 may be gradually decreased, so that the radius of curvature of the bent portion DP_CV may gradually switch from the second radius of curvature R2 to the first radius of curvature R1.

As shown in FIGS. 6 to 9, the non-attached portion UAT may be unfolded to be flat while closely contacting the slidable member SLM in the second state. The non-attached portion UAT may be spaced apart from the slidable member SLM and may be bent to have a curvature in the third state.

The non-attached portion UAT may be disposed on the bent portion DP_CV of the display panel DP in the third state. The non-attached portion UAT may mean a portion of the bottom layer RM that is folded to have a curvature only in the third state. However, the disclosure is not limited thereto. Due to the behavior of the non-attached portion UAT as described above, the stress applied to the display panel DP in case that a state of the device switches between the second state and the third state may be reduced.

In FIG. 6 to FIG. 9, the non-attached portion UAT is shown to be spaced apart from the support member SF. However, the disclosure is not limited thereto. In some embodiments, the non-attached portion UAT may be seated on a top face of the support member SF to which the first attached portion AT1 is attached in the second state. The non-attached portion UAT may be bent to be spaced apart from the top face of the support member SF in the third state.

The flexible portion RM_FP may be folded in the second state and may be unfolded to be flat in the third state. The flexible portion RM_FP may be disposed on the bent portion DP_CV of the display panel DP in the second state. The flexible portion RM_FP may overlap the bent portion DP_CV of the display panel DP in the thickness direction in the second state, and may not overlap the bent portion DP_CV of the display panel DP in the thickness direction in the third state. Unlike the protective coating layer PCL, the flexible portion RM_FP may not contact the second base member BS during the switching of the state of the display device 1. The flexible portion RM_FP may mean a portion of the bottom layer RM that is folded to have a curvature only in the second state. However, the disclosure is not limited thereto.

A length in the first direction X of the flexible portion RM_FP may be determined based on the first radius of curvature R1 of the bent portion DP_CV. The length in the first direction X of the flexible portion RM_FP may be a length measured in the first state. For example, the length in the first direction X of the flexible portion RM_FP may be approximately half of a circumference of an imaginary circle having the first radius of curvature R1. For another example, in case that the first radius of curvature R1 is in a range of about 0.5 mm to about 1.5 mm, the length in the first direction X of the flexible portion RM_FP may be in a range of about 1.5 mm to about 4.2 mm. However, the disclosure is not limited thereto.

The reversely bent portion RCR may be unfolded to be flat in the second state and may be bent to have a curvature in the third state.

The reversely bent portion RCR may have a fourth radius of curvature R4. The fourth radius of curvature R4 may be greater than or equal to each of the first radius of curvature R1 and the second radius of curvature R2. However, the disclosure is not limited thereto.

In detail, as shown in FIGS. 7 to 9, the reversely bent portion RCR may be formed while a state of the device switches from the second state to the third state. While a state of the device switches from the second state to the third state, the fourth radius of curvature R4 may be gradually decreased. On the other hand, while a state of the device switches from the third state to the second state, the fourth radius of curvature R4 may be gradually increased. In case that a state of the device is completely switched to the second state, the fourth radius of curvature R4 may be infinite.

A center of curvature of the bent portion DP_CV may be positioned on a top face of the display panel DP, while a center of curvature of the reversely bent portion RCR may be positioned on a bottom face of the display panel DP. As shown in FIGS. 7 to 9, the center of curvature of the reversely bent portion RCR may be positioned outside the display device 1. However, the disclosure is not limited thereto. The center of curvature of the reversely bent portion RCR may be positioned inside the display device 1.

As shown in FIGS. 6 to 9, in each of the first state and the second state, the protective coating layer PCL may be spaced apart from the second base member BS2. In the third state, the protective coating layer PCL may contact the second base member BS2.

While a state of the device switches from the second state to the third state or while a state of the device switches from the third state to the second state, the protective coating layer PCL may contact the second base member BS2 and then may slide in the same direction as the movement direction of the slidable member SLM while contacting the second base member BS2. The protective coating layer PCL may reduce generation of frictional force and static electricity between the display module DM and the second base member BS2 during the switching of the state of the display device 1 as described above.

As described above, the size of the protective coating layer PCL may be smaller than that of the non-attached portion UAT. In detail, in a cross-sectional view, the length in the first direction X of the protective coating layer PCL may be smaller than the length in the first direction X of the non-attached portion UAT. The length in the first direction X of each of the protective coating layer PCL and the non-attached portion UAT may be a length measured in the first state. However, the disclosure is not limited thereto. The size of the protective coating layer PCL may be greater than or equal to that of the non-attached portion UAT.

The protective coating layer PCL may be disposed to cover a portion of the non-attached portion UAT which may contact the second base member BS2. The length in the first direction X of the protective coating layer PCL may be greater than or equal to a length in the first direction X of a portion of the display module DM that contacts the second base member BS2 in case that the state of the display device 1 switches from a state to another state. The length in the first direction X of the portion thereof which may contact the second base member BS2 may be a length measured in the first state.

A position and the size of the protective coating layer PCL may be determined based on the radius of curvature of the display panel DP.

The protective coating layer PCL may be disposed to cover a portion of the display module DM closest to the second base member BS2 in case that the slidable member SLM slides. The protective coating layer PCL may be disposed to cover (or overlap) a portion that contacts the second base member BS2 and thus causes friction in case that the slidable member SLM slides if the display module DM is free of the protective coating layer PCL. In this case, the portion may be, for example, a side (a portion) of the non-attached portion UAT adjacent to the flexible portion RM_FP.

The length in the first direction X of the protective coating layer PCL may be determined based on the first radius of curvature R1 and the second radius of curvature R2. For example, the length in the first direction X of the protective coating layer PCL may be in a range of about 6 to 20 times of the first radius of curvature R1. For another example, the length in the first direction X of the protective coating layer PCL may be in a range of about 1.2 times to 6 times of the second radius of curvature R2. For still another example, in case that the first radius of curvature R1 is in a range of about 0.5 mm to about 1.5 mm, and the second radius of curvature R2 is in a range of about 1.5 mm to about 3.0 mm, the length in the first direction X of the protective coating layer PCL may be in a range of about 4.1 mm to about 9.5 mm. The disclosure is not limited thereto.

Figure 10:
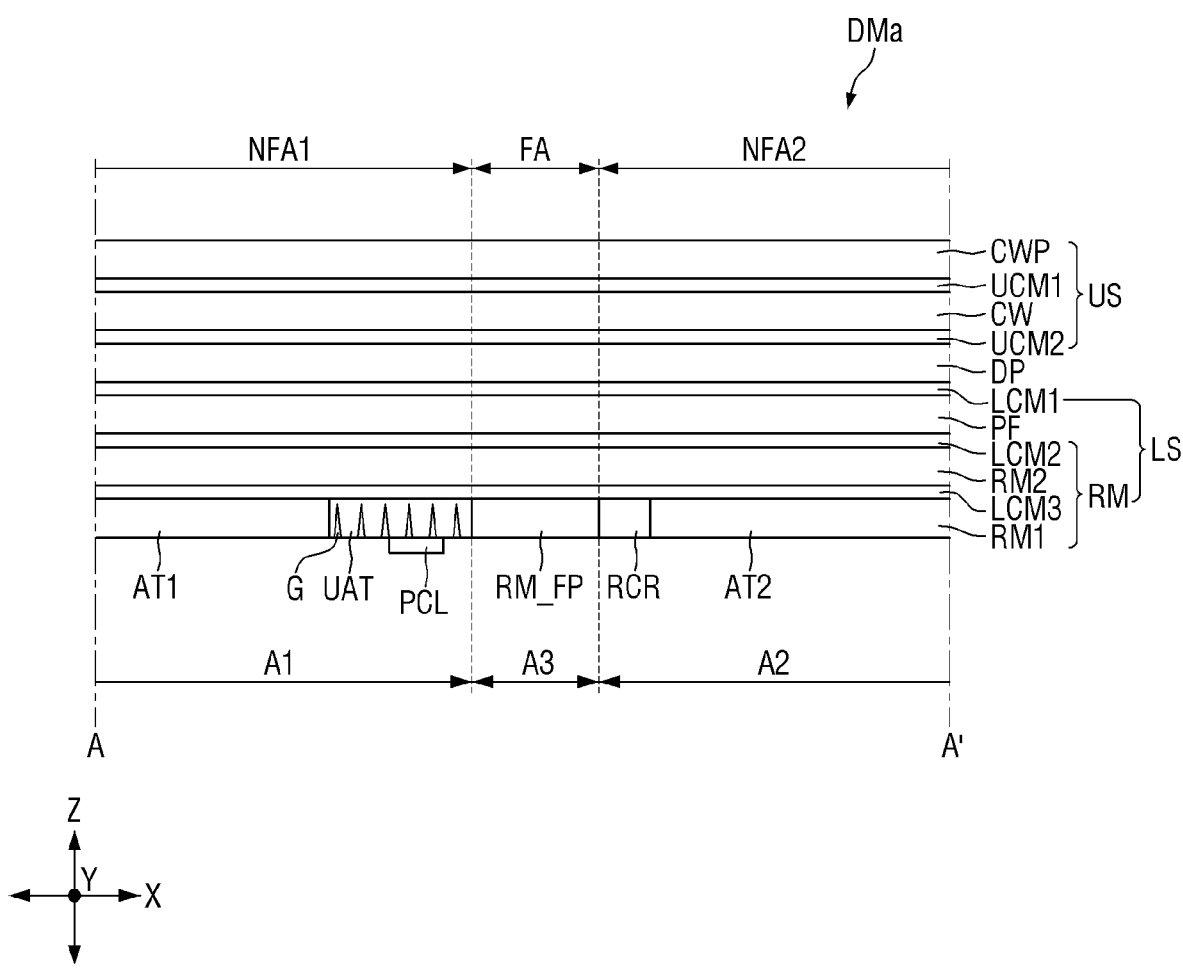
FIG. 10 is a schematic cross-sectional view of a display module according to another embodiment.

FIG. 10 is a schematic cross-sectional view of a display module DMa according to another embodiment.

The embodiment in FIG. 10 is different from the embodiment in FIGS. 1 to 9 at least in that the bottom layer RM includes multiple layers.

In FIG. 10, two layers are illustrated as the layers constituting the bottom layer RM. However, the number of the layers is not limited thereto.

The bottom layer RM may include a first bottom layer RM1 and a second bottom layer RM2.

The first bottom layer RM1 may be disposed on a bottom face of the polymer film layer PF. The second bottom layer RM2 may be disposed on a bottom face of the first bottom layer RM1.

The first bottom layer RM1 and the second bottom layer RM2 may be respectively functional layers that perform different functions. The functional layer may include, for example, at least one of a heat dissipation layer, a cushion layer (a shock absorption layer), a rigidity reinforcement layer, a digitizer, an electromagnetic wave shielding layer, and the like. In an embodiment, the first bottom layer RM1 may act as a heat dissipation layer, and the second bottom layer RM2 may act as a cushion layer.

The first bottom layer RM1 may include a metal. For example, the first bottom layer RM1 may be a metal plate. The metal may include a metal having excellent thermal conductivity, for example, copper, nickel, ferrite, or silver, or an alloy of at least two thereof. However, the disclosure is not limited thereto.

The second bottom layer RM2 may include, for example, a polymer resin such as polyurethane, polycarbonate, polypropylene, polyethylene, and the like. In some embodiments, the second bottom layer RM2 may include a material having elasticity, such as rubber, silicone, or a synthetic sponge formed by foam molding urethane-based material or an acrylic-based material. However, the disclosure is not limited thereto.

The display module DM may further include a third lower bonding member LCM3 interposed between the first bottom layer RM1 and the second bottom layer RM2 to bond the first bottom layer RM1 and the second bottom layer RM2 to each other. The third lower bonding member LCM3 and the first lower bonding member LCM1 or the second lower bonding member LCM2 may be made of substantially the same or similar material.

The embodiment of FIG. 10 is different from the embodiment of FIGS. 1 to 9 at least in that the bottom layer RM includes multiple layers. Thus, redundant descriptions thereof are omitted below.

Figure 11:
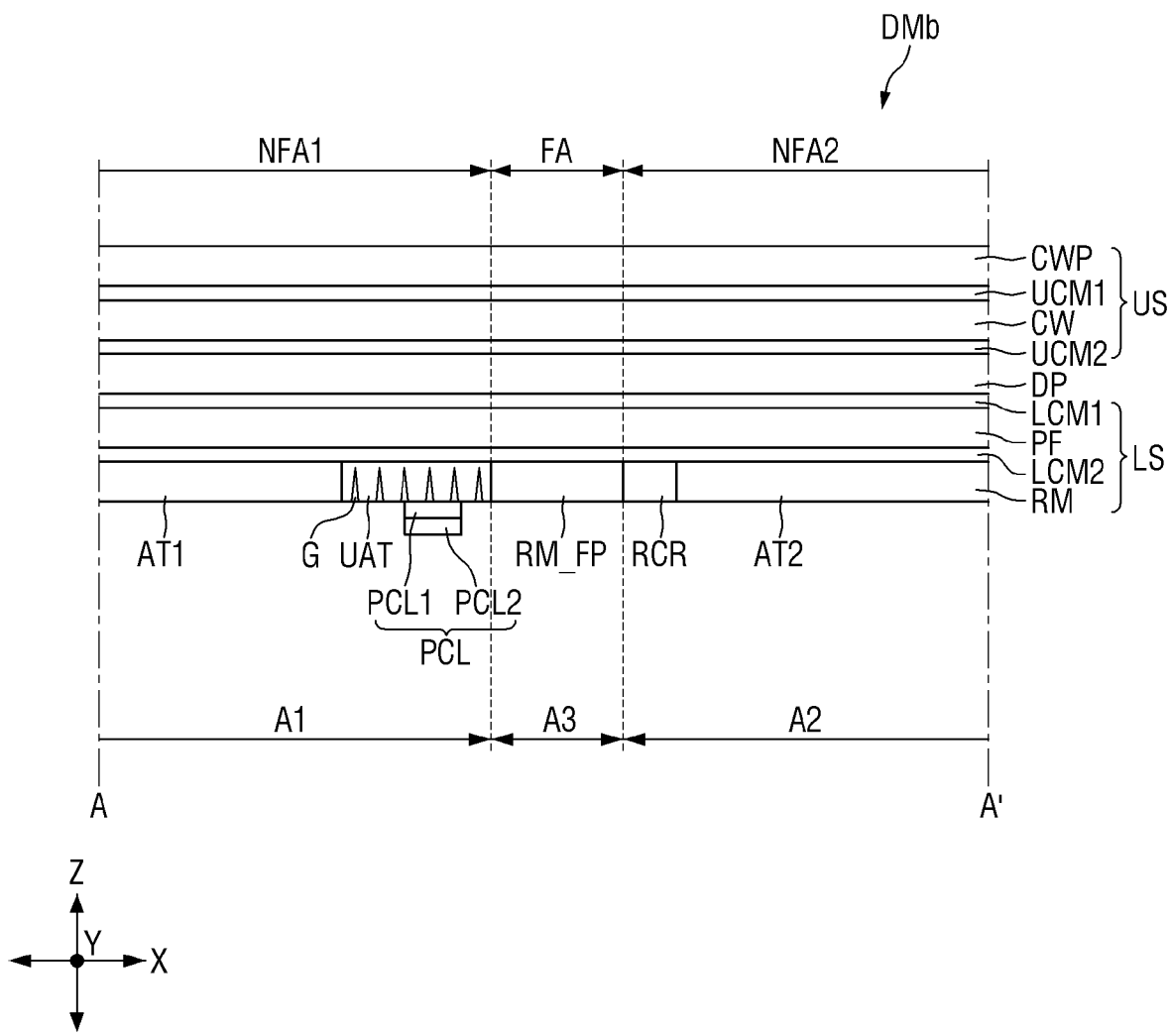
FIG. 11 is a schematic cross-sectional view of a display module according to still another embodiment.

FIG. 11 is a schematic cross-sectional view of a display module DMb according to still another embodiment.

The embodiment of FIG. 11 is different from the embodiment of FIGS. 1 to 9 in that the protective coating layer PCL includes multiple layers.

In FIG. 11, two layers are illustrated as the layers forming (or constituting) the protective coating layer PCL. However, the number of the layers is not limited thereto.

Referring to FIG. 11, the protective coating layer PCL may include a first protective coating layer PCL1 and a second protective coating layer PCL2.

The first protective coating layer PCL1 may be disposed on a bottom face of the non-attached portion UAT. The second protective coating layer PCL2 may be disposed on a bottom face of the first protective coating layer PCL1.

The first protective coating layer PCL1 and the second protective coating layer PCL2 may perform different functions. In an embodiment, the first protective coating layer PCL1 may perform an antistatic function, while the second protective coating layer PCL2 may perform a frictional force reduction function. The first protective coating layer PCL1 may include a material for the antistatic ability, and the second protective coating layer PCL2 may include a material for the slip ability. Examples of the materials are as described above with reference to FIG. 4. For example, the first protective coating layer PCL1 may act as an AS coating layer, and the second protective coating layer PCL2 may act as a slip coating layer. However, the disclosure is not limited thereto. The first protective coating layer PCL1 and the second protective coating layer PCL2 may perform the same function.

At least one of the first protective coating layer PCL1 or the second protective coating layer PCL2, and the cover window CW may include substantially the same material. The material may be at least one of a material for antistatic ability or a material for slip ability.

The embodiment of FIG. 11 is different from the embodiment of FIGS. 1 to 9 at least in that the protective coating layer PCL in the embodiment of FIG. 11 includes multiple layers. Thus, redundant descriptions thereof are omitted below.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:

1. A display device comprising:
   a display panel including:
      a side that displays an image; and
      another side opposite to the side;
   a bottom layer disposed on the another side of the display panel, the bottom layer including:
      a side facing toward the display panel; and
      another side opposite to the side of the bottom layer; and
   a foldable member disposed on the another side of the bottom layer,
   wherein the bottom layer includes:
      a non-attached portion not attached to the foldable member; and
      a protective coating layer disposed on the another side of the bottom layer and overlapping the non-attached portion.

2. The display device of claim 1, wherein the protective coating layer includes:
   at least one of a slip coating layer and an AS (anti-static) coating layer.

3. The display device of claim 1, wherein the protective coating layer includes:
   an AS coating layer disposed on the another side of the bottom layer; and
   a slip coating layer disposed on the AS coating layer.

4. The display device of claim 1, wherein the bottom layer includes a metal plate.

5. The display device of claim 1, wherein the foldable member includes:
   a hinge member for providing a pivoting axis;
   a first base member disposed on a side of the hinge member;
   a support member overlapping the first base member, a gap between the support member and the pivoting axis is maintained to be constant;
   a second base member disposed on an another side of the hinge member; and
   a slidable member connected to the second base member, the slidable member being slidable such that a gap between the slidable member and the pivoting axis varies.

6. The display device of claim 5, wherein
   the protective coating layer contacts the support member in case that the display panel is folded, and
   the protective coating layer is spaced apart from the support member in case that the slidable member slides.

7. The display device of claim 5, wherein the protective coating layer contacts the second base member in case that the slidable member slides.

8. The display device of claim 5, wherein the protective coating layer is slidable while contacting the second base member in case that the display panel slides.

9. The display device of claim 8, wherein
   the protective coating layer is between the bottom layer and the support member in case that the display panel is folded, and
   the protective coating layer is between the bottom layer and the second base member in case that the slidable member slides.

10. The display device of claim 1, wherein the display device has:
    a first state in which the display panel is unfolded to be flat;
    a second state in which the display panel is folded so that the side of the display panel is not exposed to an outside; and
    a third state in which the display panel has been moved from the second state so that a portion of the side of the display panel is exposed to the outside.

11. The display device of claim 10, wherein the protective coating layer contacts the foldable member in the third state.

12. The display device of claim 10, wherein the protective coating layer is unfolded to be flat in the second state and is bent in the third state.

13. The display device of claim 10, wherein
    the display panel includes a bent portion, the bent portion having a curvature in each of the second state and the third state, and
    a radius of curvature of the bent portion in the second state and a radius of curvature of the bent portion in the third state are different from each other.

14. The display device of claim 13, wherein
    the bent portion has a first radius of curvature in the second state and a second radius of curvature in the second state, and
    the second radius is greater than the first radius.

15. The display device of claim 13, wherein the protective coating layer is disposed on the bent portion in the third state.

16. The display device of claim 13, wherein a position of the bent portion in the third state is different from a position of the bent portion in the second state.

17. A display device comprising:
    a display panel including:
       a side that displays an image; and
       another side opposite to the side;
    a bottom layer disposed on the another side of the display panel, the bottom layer including:
       a side facing toward the display panel; and
       another side opposite to the side of the bottom layer;
    a base member disposed on the another side of the bottom layer;
    a slidable member attachable on the another side of the bottom layer and slidably connected to the base member; and
    a protective coating layer disposed on the another side of the bottom layer, the protective coating layer contacting the base member in case that the slidable member slides.

18. The display device of claim 17, wherein the protective coating layer includes at least one of a slip coating layer and an AS (anti-static) coating layer.

19. The display device of claim 17, further comprising:
    a support member attachable on the another side of the bottom layer and spaced apart from the slidable member, wherein
    the bottom layer includes a non-attached portion overlapping the support member and not attached to the support member,
    the protective coating layer is disposed on the another side of the bottom layer and overlaps the non-attached portion.

20. The display device of claim 17, wherein
the display panel is folded to have a curvature, and
a curvature of the display panel varies in case that the slidable member slides.

* * * * *